(12) United States Patent
Kang et al.

(10) Patent No.: US 7,259,070 B2
(45) Date of Patent: Aug. 21, 2007

(54) SEMICONDUCTOR DEVICES AND METHODS FOR FABRICATING THE SAME

(75) Inventors: Min-Kyu Kang, Seoul (KR); Won-Hyung Ryu, Kyonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 69 days.

(21) Appl. No.: 11/029,993

(22) Filed: Jan. 4, 2005

(65) Prior Publication Data

US 2005/0124122 A1  Jun. 9, 2005

Related U.S. Application Data

(62) Division of application No. 10/350,733, filed on Jan. 23, 2003, now Pat. No. 6,855,993.

(30) Foreign Application Priority Data

Jan. 23, 2002 (KR) .................. 2002-3871

(51) Int. Cl.
*H01L 21/336* (2006.01)
(52) U.S. Cl. ............ 438/278; 438/592; 438/532; 257/E21.623
(58) Field of Classification Search ........ 438/532, 438/592, FOR. 193, 278; 257/E21.623
See application file for complete search history.

(56) References Cited

U.S. PATENT DOCUMENTS

| | | | |
|---|---|---|---|
| 5,210,042 A | 5/1993 | Oshikawa | |
| 5,384,478 A | 1/1995 | Hong | |
| 5,648,289 A | 7/1997 | Park | |
| 5,994,745 A | 11/1999 | Hong | |
| 6,087,699 A | 7/2000 | Wann et al. | |
| 6,395,606 B1 | 5/2002 | Huster et al. | |

FOREIGN PATENT DOCUMENTS

KR  2000-0076517  12/2000

OTHER PUBLICATIONS

English language abstract of Korean Publication No. 2000-0076517.

*Primary Examiner*—George Fourson
(74) *Attorney, Agent, or Firm*—Marger Johnson & McCollom, P.C.

(57) ABSTRACT

Disclosed are semiconductor devices and methods for fabricating the same. According to one embodiment, the method includes sequentially forming a gate insulation layer and a conductive layer on a semiconductor substrate. A buried impurity region is then formed in the semiconductor substrate. Thus, the gate insulation layer is formed before forming the buried impurity region, thereby substantially reducing impurity diffusion that can be caused by a thermal process for forming the gate insulation layer. In addition, the gate insulation layer is not exposed, thus protecting the gate insulation layer from being recessed.

17 Claims, 3 Drawing Sheets

SEMICONDUCTOR DEVICES AND METHODS FOR FABRICATING THE SAME

RELATED APPLICATION

This application is a Divisional of U.S. Pat. No. 10/350,733, filed on Jan. 23, 2003, now U.S. Pat. No. 6,855,993, which claims priority from Korean Patent Application No. 2002-03871, filed on Jan. 23, 2002, both of which are herein incorporated by reference in their entirety.

BACKGROUND OF THE INVENTION

1. Field of the Invention

The present invention relates to semiconductor devices and methods of fabricating the same.

2. Description of the Related Art

Mask ROMs are largely divided into NAND-type ROMs and NOR-type ROMs. While the NAND-type ROM has a slow operating speed, it is adequate for high integration due to its small unit cell area. On the other hand, the NOR-type ROM has a high operating speed, but is not suitable for high integration due to its great unit cell area. Therefore, a flat NOR-type ROM structure, which enables both a high operating speed of the NOR-type ROM and a small cell area of the NAND-type ROM, has been proposed. The flat NOR-type ROM is a type of mask ROMs in which a device isolation layer and a contact plug are not included in a unit cell. The flat NOR-type ROM adopts a buried impurity region disposed in a semiconductor substrate as a bit line.

FIGS. 1 to 3 are cross-sectional views illustrating a method for fabricating a conventional flat NOR-type ROM semiconductor device.

Referring to FIG. 1, a buffer oxide layer 20, an anti-reflecting layer 30, and a photoresist layer are sequentially formed on a semiconductor substrate 10. The photoresist layer is patterned using a typical photolithographic process, thereby forming a photoresist pattern 40 that exposes a region of the anti-reflecting layer 30. The anti-reflecting layer 30 is used to form the photoresist pattern 40 and is typically composed of silicon oxynitride (SiON).

Next, an ion implantation process is implemented using the photoresist pattern 40, as an ion implantation mask, to form an impurity region 50 in the semiconductor substrate 10. Through the ion implantation process, arsenic (As) ions are implanted into the semiconductor substrate 10, penetrating the anti-reflecting layer 30 and the buffer oxide layer 20. At this time, silicon atoms of the semiconductor substrate 10 are deviated from a lattice structure by a kinetic energy of the arsenic ions. As a result, the impurity region 50 has lattice defects.

Referring to FIG. 2, after forming the impurity region 50, the photoresist pattern 40 is removed to expose the anti-reflecting layer 30. Thereafter, the exposed anti-reflecting layer 30 is removed using an etchant containing phosphoric acid ($H_2PO_4$).

Etching of the anti-reflecting layer 30 using the phosphoric acid may cause etching damages to the buffer oxide layer 20 thereunder. That is, the buffer oxide layer 20 may suffer from an increase in thickness deviation as well as degradation of physical/electrical (device) characteristics. Thus, the buffer oxide layer 20 is not used for a gate insulation layer of a transistor and is thus removed by an etchant containing a fluoric acid. As a result, as illustrated in FIG. 2, the entire top surface of the semiconductor substrate 10 is exposed.

Referring to FIG. 3, a gate insulation layer 60 and 65 is formed on the semiconductor substrate 10, in which the buffer oxide layer 20 is removed. The process of forming the gate insulation layer 60 and 65 is an important process determining characteristics of MOS transistors. The gate insulation layer 60 and 65 is typically formed by thermally oxidizing the exposed semiconductor substrate 10.

The thermal oxidation process is typically conducted at approximately 850° C. Such a high-temperature thermal oxidization may, however, cause diffusion of impurities in the impurity region 50. Thus, the impurities in the impurity region 50 can be diffused to form a buried impurity region 55 having a greater width and depth. The buried impurity regions 55 serve as source/drain regions of the flat NOR-type ROM and as interconnections for connecting the source/drain regions.

The gate insulation layer 60 and 65 should be formed to a predetermined thickness ($t_{ox}$) or more to fabricate a reliable MOS transistor. However, as illustrated in FIG. 2, the top surface of the semiconductor substrate 10 is completely exposed during removal of the anti-reflecting layer 30. Thus, while the gate insulation layer 60 is formed to the thickness of the impurities As in the impurity region 50 can be excessively diffused. As a result, the distance 11 between the adjacent buried impurity regions 55 is reduced, causing a short channel effect, impeding high integration of semiconductor devices.

Further, in the thermal oxidization, the impurity region 50 having lattice defects is easily and rapidly oxidized as compared with other regions on the semiconductor substrate. Thus, the gate insulation layer 65 formed on the impurity region 50 has a thickness greater than that formed on the other regions, which also is not desirable for high integration of semiconductor devices.

SUMMARY OF THE INVENTION

It is, therefore, a feature of the present invention to provide semiconductor devices, e.g., mask ROM devices adequate for high integration.

It is another feature, among others, of the present invention to provide methods for fabricating semiconductor devices such as mask ROM devices capable of preventing a short channel effect to be adequate for high integration.

In accordance with one embodiment of the present invention, there is provided a method for fabricating a mask ROM device comprising forming a gate insulation layer before forming a buried impurity region. The method comprises sequentially forming a gate insulation layer and a lower conductive layer on a semiconductor substrate. A buried impurity region is then formed in the semiconductor substrate. Next, an upper conductive layer is formed on the lower conductive layer. Next, the upper and lower conductive layers are successively patterned to form upper and lower conductive patterns that extend across the buried impurity region.

Before forming the buried impurity region, the method for fabricating a mask ROM device may further comprise etching a portion of the lower conductive layer such that another portion of the lower conductive layer remains on the buried impurity region.

In accordance with another embodiment of the present invention, there is provided a mask ROM device that substantially reduces diffusion of a buried impurity region. The mask ROM device comprises a buried impurity region disposed in a semiconductor substrate, a gate electrode extending across the buried impurity region, and a gate insulation layer disposed between the gate electrode and the semiconductor substrate. The gate insulation layer has a substantially uniform thickness.

According to one embodiment, the gate electrodes include a lower conductive pattern and an upper conductive pattern, which are sequentially stacked. The lower conductive pattern may include a recessed trench region disposed over the buried impurity region.

Consequently, as described above, the gate insulation layer is formed before forming the buried impurity region, thereby substantially reducing impurity diffusion that can be caused by a thermal process for forming the gate insulation layer. In addition, because the gate insulation layer is covered with a conductive layer, the gate insulation layer can be prevented from being recessed during processing steps such as ion implantation or cleaning.

DESCRIPTION OF THE PREFERRED EMBODIMENTS

Figure 1:
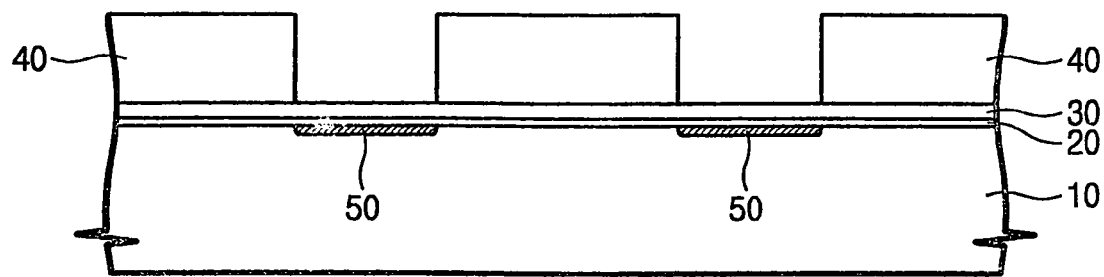
FIGS. 1 to 3 are cross-sectional views illustrating a method for fabricating a conventional mask ROM semiconductor device.
Figure 2:
Figure 3:
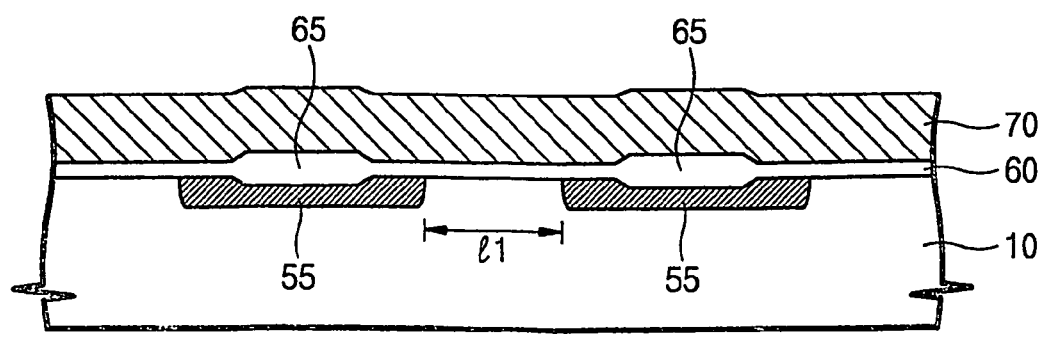

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 4:
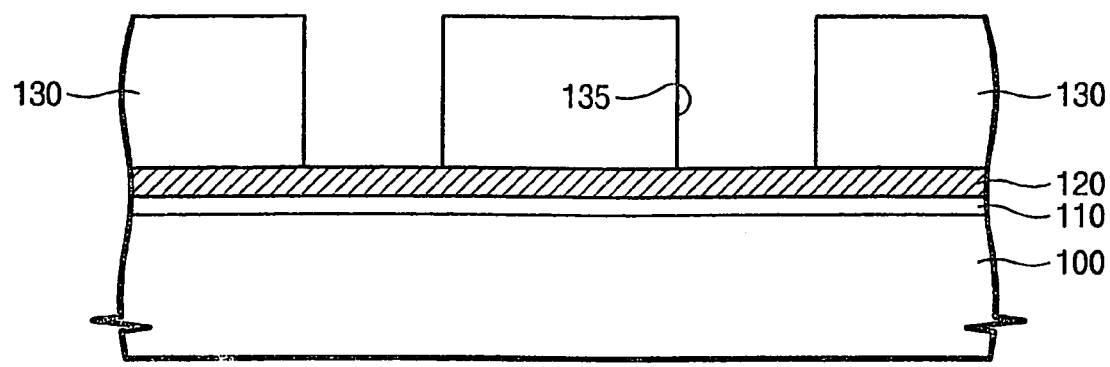
FIGS. 4 to 6 are cross-sectional views illustrating a method for fabricating a mask ROM semiconductor device according to an embodiment of the present invention.
Figure 5:
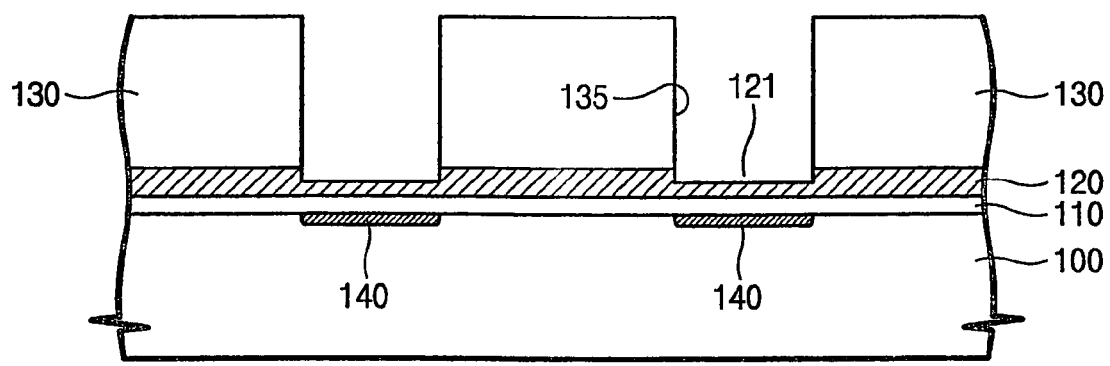
Figure 6:
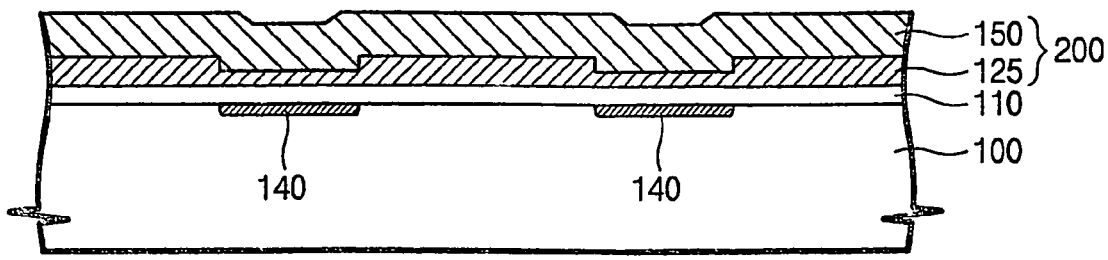

FIGS. 4 to 6 are cross-sectional views illustrating a method for fabricating a mask ROM semiconductor device according to an embodiment of the present invention.

Referring to FIG. 4, a device isolation layer (not shown) is formed at a predetermined region of a semiconductor substrate 100. A gate insulation layer 110, a lower conductive layer 120, and a photoresist layer (not shown) are sequentially formed on the semiconductor substrate 100 including the device isolation layer. The photoresist layer is patterned using a typical photolithographic process, thereby forming a photoresist pattern 130 that has a plurality of openings 135 to expose the lower conductive layer 120. The openings 135 define buried impurity regions of a flat cell ROM. Thus, the openings 135 are preferably formed in the shape of parallel lines.

The gate insulation layer 110 is preferably a thermal oxide layer obtained by thermally oxidizing the exposed semiconductor substrate 100 between the device isolation layers. The thermal oxidization process is preferably conducted at approximately 850° C. Also, the gate insulation layer 110 may be a silicon oxynitride layer or any other suitable dielectric layers. The gate insulation layer 110 of the present invention is not removed until the final process step, in contrast with the conventional method.

The lower conductive layer 120 is used as an anti-reflecting layer during the photolithographic process for forming the photoresist pattern 130 and also as a gate electrode for a semiconductor device. Thus, the lower conductive layer 120 is preferably a polysilicon layer, which has conductivity and may be used as an anti-reflecting layer. The lower conductive layer 120 is preferably formed to a thickness of approximately 10 to 1000 Å.

In the conventional method, a silicon oxynitride layer is used for the anti-reflecting layer, and this may undesirably generate particles harmful to the semiconductor device. However, in the case that the foregoing polysilicon layer is used for the anti-reflecting layer, particles can be substantially reduced.

To intensify the anti-reflection function, a widely used anti-reflective coating (ARC, not shown), which is composed of one selected from the group consisting of silicon oxynitride (SiON) and organic materials containing a hydrocarbon group compound, may be additionally formed.

Referring to FIG. 5, the lower conductive layer 120 exposed under the opening 135 is partially etched using the photoresist pattern 130 as an etch mask. The etching process is carried out to remain the lower conductive layer 120 under the opening 135, such that the gate insulation layer 110 is not exposed. Thus, a trench region 121, in which the lower conductive layer 120 is recessed, is formed under the opening 135.

Thereafter, an ion implantation process is implemented using the photoresist pattern 130 as an ion implantation mask. Thus, a buried impurity region 140 is formed in the semiconductor substrate 100 under the opening 135. The ion implantation process is preferably performed by implanting impurities such as arsenic (As) ions at approximately $10^{14}$ atoms/cm$^2$ dose or more. The impurities are implanted into the semiconductor substrate 100, penetrating the lower conductive layer 120 and the gate insulation layer 110. The process of etching the lower conductive layer 120 for forming the trench region 121 is performed so as to form material layers where the impurities penetrate, to a thickness appreciably thinner than that of the conventional impurity regions. Thus, a kinetic energy of the impurities may be reduced during the ion implantation process. As a result, diffusion of the impurities can be substantially reduced.

According to another embodiment, after implementing the ion implantation process for forming the buried impurity region 140, a rapid thermal process (RTP) may be further carried out so as to activate the implanted impurities. The RTP may cure defects of the semiconductor substrate 100 and the gate insulation layer 110 and reduce diffusion of the implanted impurities.

When the lower conductive layer 120 has a sufficiently thin thickness, the etching process for forming the trench region may be omitted.

Referring to FIG. 6, after forming the buried impurity region 140, the photoresist pattern 130 is removed to expose the lower conductive layer 120. Also, as illustrated in FIG. 4, if the anti-reflecting layer is formed on the lower conductive layer 120, after removing the photoresist pattern 130, removing the anti-reflecting layer is further performed.

In the conventional method, the gate insulation layer 110 may be undesirably recessed during removal of the anti-reflecting layer. However, according to an aspect of the present invention, because the gate insulation layer 110 is substantially entirely covered with the lower conductive layer 120, the gate insulation layer 110 is not exposed during removal of, for example, the photoresist pattern 130. The gate insulation layer 110 is, therefore, prevented from being recessed. Also, according to an embodiment of the present invention, because the lower conductive layer 120 covers the gate insulation layer 110 at least under a gate electrode 200 until the final process step is completed, the gate insulation layer 110 can be protected (not etched).

An upper conductive layer (not shown) is formed on the exposed lower conductive layer 120. The upper conductive layer is preferably a polysilicon layer and a silicide layer, which are sequentially stacked. Also, after forming the upper conductive layer, another anti-reflecting layer may be further formed on the upper conductive layer to form gate electrodes.

The upper conductive layer and the lower conductive layer 120 are successively patterned to expose the gate insulation layer 110, thereby forming upper and lower conductive patterns 150 and 125 that extend across the buried impurity region 140. At this time, the upper and lower conductive patterns 150 and 125 constitute a gate electrode 200 of a flat cell ROM. The etching process for forming the gate electrode 200 is preferably performed by an anisotropic etch process using an etch recipe having an etch selectivity with respect to the gate insulation layer 110.

According to an aspect of the present invention, the gate insulation layer 110 is formed before forming the buried impurity region 140. Thus, it is capable of preventing excessive diffusion of the buried impurity region 140, which could be caused by a thermal process for forming the gate insulation layer 110. The gate insulation layer 110 is not exposed at least under the gate electrode 200 and still remains until the final process step is completed. Thus, the gate insulation layer 110 is not exposed and recessed during the subsequent processing steps such as a cleaning step.

Thereafter, an interlayer dielectric layer (ILD) and a metal interconnection are formed on the semiconductor substrate 100 including the gate electrode 200.

Figure 7:
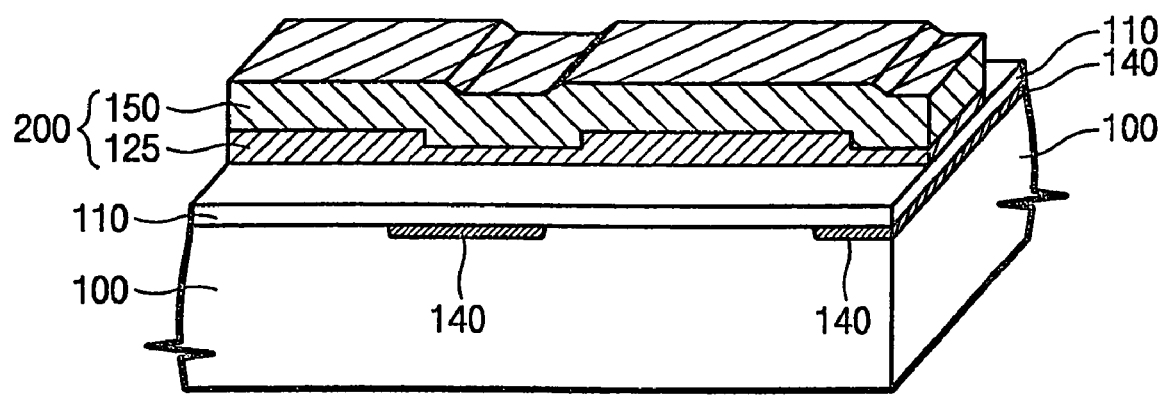
FIG. 7 is a perspective view illustrating the mask ROM semiconductor device according to the embodiment of the present invention.

FIG. 7 is a perspective view illustrating the flat cell ROM semiconductor device according to an embodiment of the present invention formed according to the process described above.

Referring to FIG. 7, a plurality of buried impurity regions 140 are disposed at predetermined regions of the semiconductor substrate 100. The buried impurity regions 140 are preferably disposed in parallel with each other. The buried impurity regions 140 include, for example, arsenic (As) impurity ions, of which concentration is preferably at least 1018 atoms/cm$^3$. Thus, the buried impurity regions 140 may have a low resistance, and this allows the buried impurity regions 140 to serve as source/drain regions of the flat cell ROM and as interconnections for connecting the source/drain regions.

A plurality of gate electrodes 200, which extend across the buried impurity region 140, are disposed on the semiconductor substrate 100 including the buried impurity region 140. The gate electrodes 200 are preferably disposed in parallel with each other. Each of the gate electrodes 200 includes lower and upper conductive patterns 125 and 150, which are sequentially stacked. The lower conductive pattern 125 is a polysilicon layer, and the upper conductive pattern 150 is preferably a polysilicon layer and a silicide layer, which are sequentially stacked. Further, an anti-reflecting layer (not shown) may be additionally disposed on the upper conductive pattern 150.

In addition, the lower conductive pattern 125 may have a recessed trench region over the buried impurity region 140. Owing to the recessed trench region, the lower conductive pattern 125 has a thinner thickness over the buried impurity region 140 than other regions. It is preferable that the lower conductive pattern 125 over the buried impurity region 140 have a thickness of at least about 10 Å.

A gate insulation layer 110 is disposed between the semiconductor substrate 100 and the lower conductive pattern 125. At this time, in contrast with the conventional methods, the gate insulation layer 110 has a substantially uniform thickness under the gate electrode 200. The gate insulation layer 110 is preferably a silicon oxide layer, but may be a silicon oxynitride layer or any other suitable dielectric layers.

According to an embodiment of the present invention, a process of forming a gate insulation layer including a thermal process is followed by a process of forming a buried impurity region. This substantially reduces lateral diffusion of impurities in the buried impurity region. As a result, a short channel effect can be prevented and highly integrated mask ROMs can thus be fabricated.

Also, according to an aspect of the present invention, exposure of the gate insulation layer may be prevented. Thus, it is capable of inhibiting thinning of the gate insulation layer during, for example, a cleaning process. Consequently, more reliable mask ROMs can be fabricated.

Although the present invention has been described in connection with mask ROMs, the principles of the present invention can be applied to other types of semiconductor devices such as embedded semiconductor devices, multi-chip packages, or a system-on-chip (SOC).

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of fabricating a semiconductor device, the method comprising:
   sequentially forming a gate insulation layer and a lower conductive layer on a semiconductor substrate;
   forming a photoresist pattern on the lower conductive layer;
   forming a pair of buried impurity regions in the semiconductor substrate by performing an ion implantation process using the photoresist pattern as an ion implantation mask;
   removing the photoresist pattern to expose the lower conductive layer;
   forming an upper conductive layer on the lower conductive layer; and
   successively patterning the upper and lower conductive layers to form upper and lower conductive patterns that extend across the pair of buried impurity regions.

2. The method as claimed in claim 1, wherein the gate insulation layer is formed by thermally oxidizing the semiconductor substrate.

3. The method as claimed in claim 1, wherein the lower conductive layer is used as an anti-reflecting layer during a photolithographic process for forming the photoresist pattern.

4. The method as claimed in claim 1, wherein the lower conductive layer is formed of polysilicon.

5. The method as claimed in claim 1, further comprising etching a portion of the lower conductive layer to form a recessed trench region therein, using the photoresist pattern as an etch mask, before forming the pair of buried impurity regions thereunder.

6. The method as claimed in claim 5, wherein etching a portion of the lower conductive layer is performed such that another portion of the lower conductive layer remains on the pair of buried impurity regions.

7. The method as claimed in claim 1, wherein the upper conductive layer comprise a polysilicon layer and a silicide layer, which are sequentially stacked.

8. The method as claimed in claim 1, further comprising performing a rapid thermal process (RTP) after performing the ion implantation process.

9. A method of fabricating a semiconductor device, the method comprising:
   sequentially forming a gate insulation layer and a conductive layer on a semiconductor substrate;
   after forming the conductive layer, forming a plurality of buried impurity regions in the semiconductor substrate; and
   patterning the conductive layer to form a gate electrode that extends across the plurality of buried impurity regions.

10. The method as claimed in claim 9, wherein an ion implantation process is performed to form the plurality of buried impurity regions with the conductive layer covering at least a portion of the gate insulation layer.

11. The method as claimed in claim 1, wherein the buried impurity regions are formed to serve as source/drain regions and as interconnections for connecting the source/drain regions.

12. A method of fabricating a semiconductor device, the method comprising:
   sequentially forming a gate insulation layer and a lower conductive layer on a semiconductor substrate;
   forming a photoresist pattern on the lower conductive layer;
   etching a portion of the lower conductive layer to form a recessed trench region therein, using the photoresist pattern as an etch mask;
   forming a buried impurity region in the semiconductor substrate by performing an ion implantation process using the photoresist pattern as an ion implantation mask;
   removing the photoresist pattern to expose the lower conductive layer;
   forming an upper conductive layer on the lower conductive layer; and
   successively patterning the upper and lower conductive layers to form upper and lower conductive patterns that extend across the buried impurity region.

13. The method as claimed in claim 12, wherein the gate insulation layer is formed by thermally oxidizing the semiconductor substrate.

14. The method as claimed in claim 12, wherein the lower conductive layer is used as an anti-reflecting layer during a photolithographic process for forming the photoresist pattern.

15. The method as claimed in claim 12, wherein the lower conductive layer is formed of polysilicon.

16. The method as claimed in claim 12, wherein the upper conductive layer comprise a polysilicon layer and a silicide layer, which are sequentially stacked.

17. The method as claimed in claim 12, further comprising performing a rapid thermal process (RTP) after performing the ion implantation process.

* * * * *

UNITED STATES PATENT AND TRADEMARK OFFICE
CERTIFICATE OF CORRECTION

PATENT NO. : 7,259,070 B2 Page 1 of 1
APPLICATION NO. : 11/029993
DATED : August 21, 2007
INVENTOR(S) : Min-Kyu Kang et al.

It is certified that error appears in the above-identified patent and that said Letters Patent is hereby corrected as shown below:

Column 2, line 21, the words "of the" should read -- of $t_{ox}$, the --;

Column 2, line 22, the word "11" should read -- ll --.

Signed and Sealed this

Second Day of September, 2008

JON W. DUDAS
*Director of the United States Patent and Trademark Office*